(12) United States Patent
Longo et al.

(10) Patent No.: US 7,550,857 B1
(45) Date of Patent: Jun. 23, 2009

(54) STACKED REDISTRIBUTION LAYER (RDL) DIE ASSEMBLY PACKAGE

(75) Inventors: Joseph Marco Longo, Holly Springs, NC (US); Christopher M. Scanlan, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 8 days.

(21) Appl. No.: 11/560,496

(22) Filed: Nov. 16, 2006

(51) Int. Cl.
*H01L 23/48* (2006.01)
*H01L 23/52* (2006.01)

(52) U.S. Cl. .................. 257/777; 257/686; 257/784; 257/E23.011

(58) Field of Classification Search .................. 257/784, 257/686, E23.011
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |

(Continued)

FOREIGN PATENT DOCUMENTS

JP          05-109975          4/1993

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner*—Nitin Parekh
(74) *Attorney, Agent, or Firm*—Gunnison, McKay & Hodgson, L.L.P.; Serge J. Hodgson

(57) ABSTRACT

A stacked redistribution layer (RDL) die assembly package includes a substrate, a first level RDL die assembly mounted to the substrate and a second level RDL die assembly mounted to the first level RDL die assembly. The first level RDL die assembly includes a first die comprising bond pads, a first fan out support extending outwardly from sides of the first die, and first traces electrically connected to the bond pads, the first traces being supported by the first fan out support. Similarly, the second level RDL die assembly includes a second die comprising bond pads, a second fan out support extending outwardly from sides of the second die, and second traces electrically connected to the bond pads of the second die, the second traces being supported by the second fan out support.

15 Claims, 12 Drawing Sheets

U.S. PATENT DOCUMENTS

| | | | |
|---|---|---|---|
| 5,072,075 A | 12/1991 | Lee et al. | |
| 5,072,520 A | 12/1991 | Nelson | |
| 5,081,520 A | 1/1992 | Yoshii et al. | |
| 5,091,769 A | 2/1992 | Eichelberger | |
| 5,108,553 A | 4/1992 | Foster et al. | |
| 5,110,664 A | 5/1992 | Nakanishi et al. | |
| 5,191,174 A | 3/1993 | Chang et al. | |
| 5,229,550 A | 7/1993 | Bindra et al. | |
| 5,239,448 A | 8/1993 | Perkins et al. | |
| 5,247,429 A | 9/1993 | Iwase et al. | |
| 5,250,843 A | 10/1993 | Eichelberger | |
| 5,278,726 A | 1/1994 | Bernardoni et al. | |
| 5,283,459 A | 2/1994 | Hirano et al. | |
| 5,353,498 A | 10/1994 | Fillion et al. | |
| 5,371,654 A | 12/1994 | Beaman et al. | |
| 5,379,191 A | 1/1995 | Carey et al. | |
| 5,404,044 A | 4/1995 | Booth et al. | |
| 5,463,253 A | 10/1995 | Waki et al. | |
| 5,474,957 A | 12/1995 | Urushima | |
| 5,474,958 A | 12/1995 | Djennas et al. | |
| 5,497,033 A | 3/1996 | Fillion et al. | |
| 5,508,938 A | 4/1996 | Wheeler | |
| 5,530,288 A | 6/1996 | Stone | |
| 5,531,020 A | 7/1996 | Durand et al. | |
| 5,546,654 A | 8/1996 | Wojnarowski et al. | |
| 5,574,309 A | 11/1996 | Papapietro et al. | |
| 5,581,498 A | 12/1996 | Ludwig et al. | |
| 5,582,858 A | 12/1996 | Adamopoulos et al. | |
| 5,616,422 A | 4/1997 | Ballard et al. | |
| 5,637,832 A | 6/1997 | Danner | |
| 5,674,785 A | 10/1997 | Akram et al. | |
| 5,719,749 A | 2/1998 | Stopperan | |
| 5,726,493 A | 3/1998 | Yamashita et al. | |
| 5,739,581 A | 4/1998 | Chillara et al. | |
| 5,739,585 A | 4/1998 | Akram et al. | |
| 5,739,588 A | 4/1998 | Ishida et al. | |
| 5,742,479 A | 4/1998 | Asakura | |
| 5,774,340 A | 6/1998 | Chang et al. | |
| 5,784,259 A | 7/1998 | Asakura | |
| 5,798,014 A | 8/1998 | Weber | |
| 5,822,190 A | 10/1998 | Iwasaki | |
| 5,826,330 A | 10/1998 | Isoda et al. | |
| 5,835,355 A | 11/1998 | Dordi | |
| 5,847,453 A | 12/1998 | Uematsu et al. | |
| 5,883,425 A | 3/1999 | Kobayashi | |
| 5,894,108 A | 4/1999 | Mostafazadeh et al. | |
| 5,903,052 A | 5/1999 | Chen et al. | |
| 5,907,477 A | 5/1999 | Tuttle et al. | |
| 5,936,843 A | 8/1999 | Ohshima et al. | |
| 5,952,611 A | 9/1999 | Eng et al. | |
| 6,004,619 A | 12/1999 | Dippon et al. | |
| 6,013,948 A | 1/2000 | Akram et al. | |
| 6,021,564 A | 2/2000 | Hanson | |
| 6,028,364 A | 2/2000 | Ogino et al. | |
| 6,034,427 A | 3/2000 | Lan et al. | |
| 6,040,622 A | 3/2000 | Wallace | |
| 6,060,778 A | 5/2000 | Jeong et al. | |
| 6,069,407 A | 5/2000 | Hamzehdoost | |
| 6,072,243 A | 6/2000 | Nakanishi | |
| 6,081,036 A | 6/2000 | Hirano et al. | |
| 6,119,338 A | 9/2000 | Wang et al. | |
| 6,122,171 A | 9/2000 | Akram et al. | |
| 6,127,833 A | 10/2000 | Wu et al. | |
| 6,160,705 A | 12/2000 | Stearns et al. | |
| 6,172,419 B1 | 1/2001 | Kinsman | |
| 6,175,087 B1 | 1/2001 | Keesler et al. | |
| 6,184,463 B1 | 2/2001 | Panchou et al. | |
| 6,194,250 B1 | 2/2001 | Melton et al. | |
| 6,204,453 B1 | 3/2001 | Fallon et al. | |
| 6,214,641 B1 | 4/2001 | Akram | |
| 6,235,554 B1 | 5/2001 | Akram et al. | |
| 6,239,485 B1 | 5/2001 | Peters et al. | |
| D445,096 S | 7/2001 | Wallace | |
| D446,525 S | 8/2001 | Okamoto et al. | |
| 6,274,821 B1 | 8/2001 | Echigo et al. | |
| 6,280,641 B1 | 8/2001 | Gaku et al. | |
| 6,316,285 B1 | 11/2001 | Jiang et al. | |
| 6,351,031 B1 | 2/2002 | Iijima et al. | |
| 6,353,999 B1 | 3/2002 | Cheng | |
| 6,365,975 B1 | 4/2002 | DiStefano et al. | |
| 6,376,906 B1 | 4/2002 | Asai et al. | |
| 6,392,160 B1 | 5/2002 | Andry et al. | |
| 6,395,578 B1 | 5/2002 | Shin et al. | |
| 6,405,431 B1 | 6/2002 | Shin et al. | |
| 6,406,942 B2 | 6/2002 | Honda | |
| 6,407,341 B1 | 6/2002 | Anstrom et al. | |
| 6,407,930 B1 | 6/2002 | Hsu | |
| 6,448,510 B1 | 9/2002 | Neftin et al. | |
| 6,451,509 B2 | 9/2002 | Keesler et al. | |
| 6,479,762 B2 | 11/2002 | Kusaka | |
| 6,497,943 B1 | 12/2002 | Jimarez et al. | |
| 6,517,995 B1 | 2/2003 | Jacobson et al. | |
| 6,534,391 B1 | 3/2003 | Huemoeller et al. | |
| 6,544,638 B2 | 4/2003 | Fischer et al. | |
| 6,586,682 B2 | 7/2003 | Strandberg | |
| 6,608,757 B1 | 8/2003 | Bhatt et al. | |
| 6,660,559 B1 | 12/2003 | Huemoeller et al. | |
| 6,715,204 B1 | 4/2004 | Tsukada et al. | |
| 6,727,645 B2 | 4/2004 | Tsujimura et al. | |
| 6,730,857 B2 | 5/2004 | Konrad et al. | |
| 6,734,542 B2 | 5/2004 | Nakatani et al. | |
| 6,740,964 B2 | 5/2004 | Sasaki | |
| 6,753,612 B2 | 6/2004 | Adae-Amoakoh et al. | |
| 6,774,748 B1 | 8/2004 | Ito et al. | |
| 6,787,443 B1 | 9/2004 | Boggs et al. | |
| 6,803,528 B1 | 10/2004 | Koyanagi | |
| 6,815,709 B2 | 11/2004 | Clothier et al. | |
| 6,815,739 B2 | 11/2004 | Huff et al. | |
| 6,838,776 B2 | 1/2005 | Leal et al. | 257/783 |
| 6,888,240 B2 | 5/2005 | Towle et al. | |
| 6,919,514 B2 | 7/2005 | Konrad et al. | |
| 6,921,968 B2 * | 7/2005 | Chung | 257/686 |
| 6,921,975 B2 | 7/2005 | Leal et al. | 257/723 |
| 6,931,726 B2 | 8/2005 | Boyko et al. | |
| 6,953,995 B2 | 10/2005 | Farnworth et al. | |
| 7,015,075 B2 | 3/2006 | Fay et al. | 438/127 |
| 7,030,469 B2 | 4/2006 | Mahadevan et al. | |
| 7,081,661 B2 | 7/2006 | Takehara et al. | 257/433 |
| 7,125,744 B2 | 10/2006 | Takehara et al. | 438/106 |
| 7,185,426 B1 | 3/2007 | Hiner et al. | |
| 7,198,980 B2 | 4/2007 | Jiang et al. | |
| 7,282,394 B2 | 10/2007 | Cho et al. | |
| 7,285,855 B2 | 10/2007 | Foong | |
| 7,345,361 B2 | 3/2008 | Mallik et al. | |
| 7,372,151 B1 | 5/2008 | Fan et al. | |
| 7,429,786 B2 * | 9/2008 | Karnezos et al. | 257/686 |
| 2002/0017712 A1 | 2/2002 | Bessho et al. | |
| 2002/0061642 A1 | 5/2002 | Haji et al. | |
| 2002/0066952 A1 | 6/2002 | Taniguchi et al. | |
| 2002/0195697 A1 * | 12/2002 | Mess et al. | 257/686 |
| 2003/0025199 A1 * | 2/2003 | Wu et al. | 257/724 |
| 2003/0128096 A1 | 7/2003 | Mazzochette | |
| 2003/0141582 A1 * | 7/2003 | Yang et al. | 257/686 |
| 2003/0197284 A1 * | 10/2003 | Khiang et al. | 257/777 |
| 2004/0063246 A1 | 4/2004 | Karnezos | |
| 2004/0145044 A1 | 7/2004 | Sugaya et al. | |
| 2004/0159462 A1 | 8/2004 | Chung | |
| 2005/0139985 A1 * | 6/2005 | Takahashi | 257/698 |
| 2005/0242425 A1 | 11/2005 | Leal et al. | 257/690 |

FOREIGN PATENT DOCUMENTS

| | | |
|---|---|---|
| JP | 05-136323 | 6/1993 |
| JP | 07-017175 | 1/1995 |

| | | |
|---|---|---|
| JP | 08-190615 | 7/1996 |
| JP | 10-334205 | 12/1998 |

OTHER PUBLICATIONS

Hiner et al., "Printed Wiring Motherboard Having Bonded Interconnect Redistribution Mesa", U.S. Appl. No. 10/992,371, filed on Nov. 18, 2004.

Scanlan et al., "Semiconductor Package Including a Top-Surface Metal Layer for Implementing Circuit Features", U.S. Appl. No. 11/293,999, filed on Dec. 5, 2005.

Huemoeller et al., "Buildup Dielectric and Metallization Process and Semiconductor Package", U.S. Appl. No. 11/497,617, filed on Aug. 1, 2006.

Hiner et al., "Semiconductor Package Including Top-Surface Terminals for Mounting Another Semiconductor Package", U.S. Appl. No. 11/595,411, filed Nov. 9, 2006.

Huemoeller et al., "Build Up Motherboard Fabrication Method and Structure", U.S. Appl. NO. 11/824,395, filed Jun. 28, 2007.

* cited by examiner

STACKED REDISTRIBUTION LAYER (RDL) DIE ASSEMBLY PACKAGE

BACKGROUND OF THE INVENTION

1. Field of the Invention

The present invention relates generally to the packaging of electronic components. More particularly, the present invention relates to a stacked electronic component package and method for fabricating the same.

2. Description of the Related Art

To reduce the size of electronic component packages, semiconductor dies were stacked one upon another within a stacked die package. To space the upper die above the lower bond wires connected to the bond pads of the lower die, a spacer was used.

The spacer was mounted to the upper surface of the lower die inward of the bond pads on the upper surface of the lower die. The lower bond wires were connected to the bond pads on the upper surface of the lower die. The lower surface of the upper die was mounted to the spacer, which spaced the lower surface of the upper die away from the upper surface of the lower die and the lower bond wires.

Although use of the spacer allowed same size dies to be stacked one upon another, the spacer occupied space. Thus, the spacer restricted reduction in the overall height of the electronic component package.

SUMMARY OF THE INVENTION

In accordance with one embodiment, a stacked redistribution layer (RDL) die assembly package includes a substrate, a first level RDL die assembly mounted to the substrate and a second level RDL die assembly mounted to the first level RDL die assembly. The first level RDL die assembly includes a first die comprising bond pads, a first fan out support extending outwardly from sides of the first die, and first traces electrically connected to the bond pads, the first traces being supported by the first fan out support. Similarly, the second level RDL die assembly includes a second die comprising bond pads, a second fan out support extending outwardly from sides of the second die, and second traces electrically connected to the bond pads of the second die, the second traces being supported by the second fan out support.

In one embodiment, the second level RDL die assembly is smaller than the first level RDL die assembly such that terminals of the first level RDL die assembly are exposed facilitating wire bonding thereto. In this manner, the first and second dies, e.g., having the same size, are effectively stacked one upon another without the use of a spacer. Accordingly, the height of the stacked RDL die assembly package is minimized.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
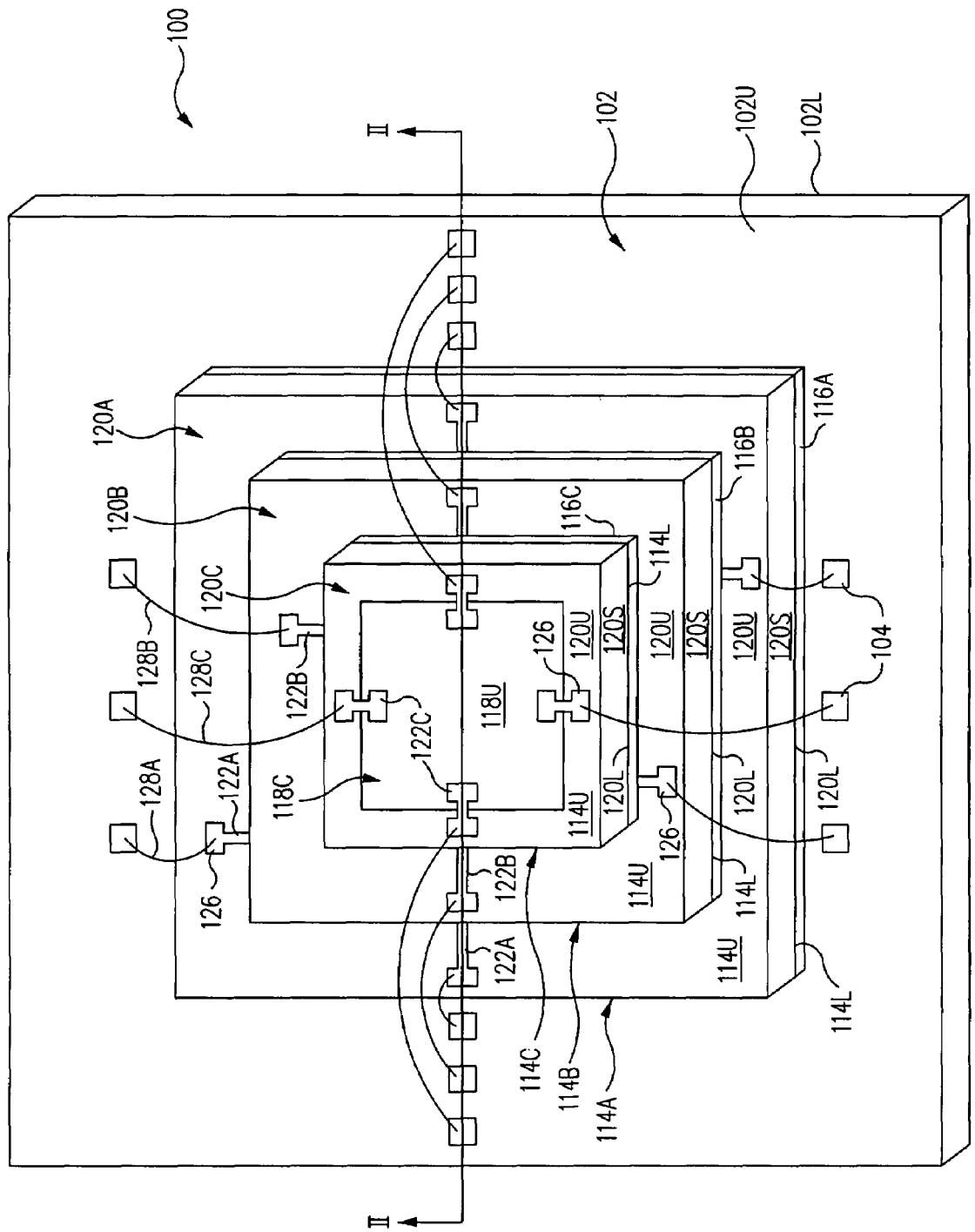
FIG. 1 is a top perspective view of a stacked redistribution layer (RDL) die assembly package in accordance with one embodiment of the present invention.
Figure 2:
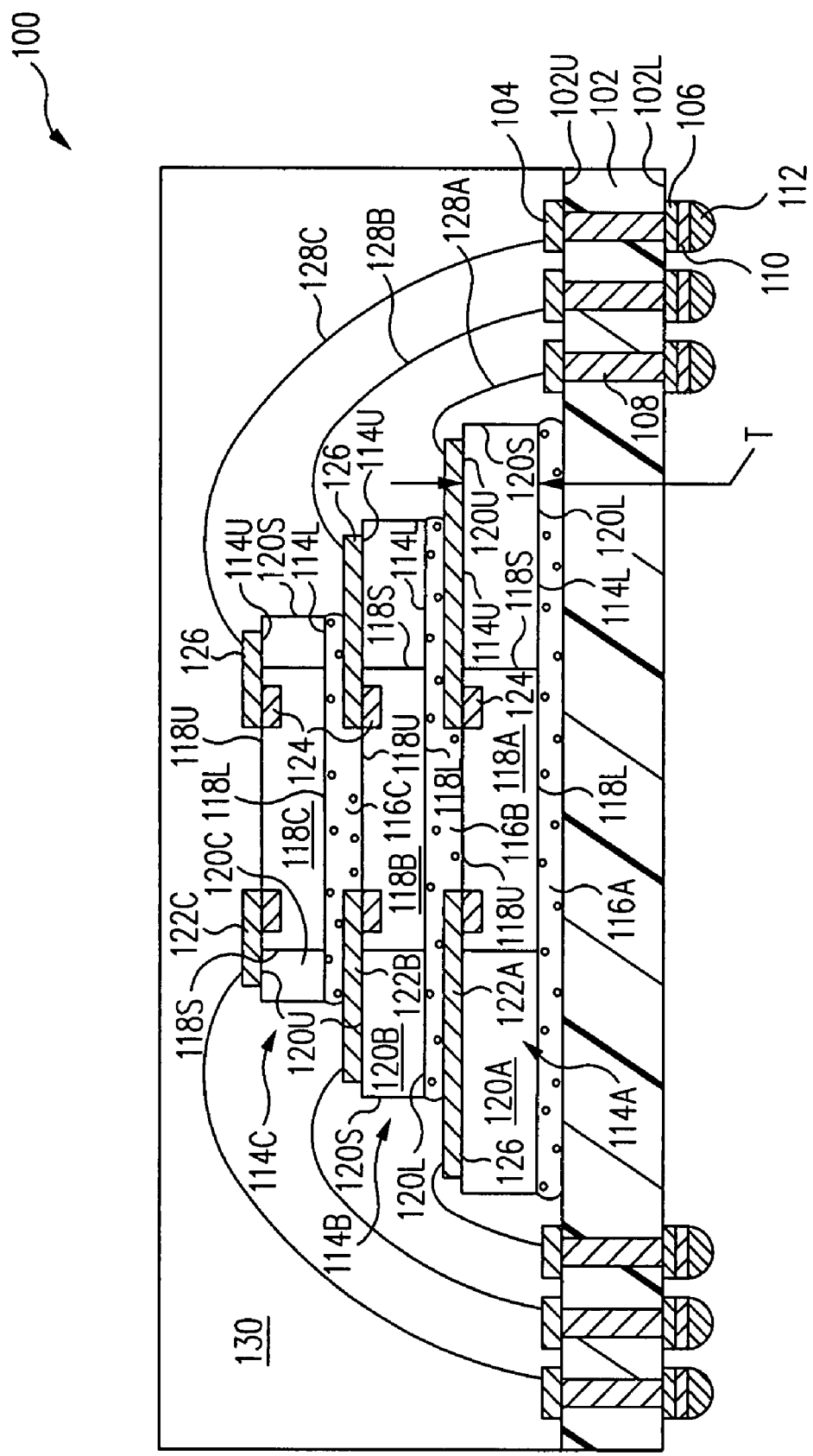
FIG. 2 is a cross-sectional view of the stacked RDL die assembly package along the line II-II of FIG. 1.

In accordance with one embodiment, referring to FIGS. 1 and 2 together, a stacked redistribution layer (RDL) die assembly package 100 includes a substrate 102, a first level RDL die assembly 114A mounted to substrate 102 and a second level RDL die assembly 114B mounted to first level RDL die assembly 114A. First level RDL die assembly 114A includes a first die 118A comprising bond pads 124, a first fan out support 120A extending outwardly from sides 118S of first die 118A, and first traces 122A electrically connected to bond pads 124, first traces 122A being supported by first fan out support 120A. Similarly, second level RDL die assembly 114B includes a second die 118B comprising bond pads 124, a second fan out support 120B extending outwardly from sides 118S of second die 118B, and second traces 122B electrically connected to bond pads 124 of second die 118B, second traces 122B being supported by second fan out support 120B.

In one embodiment, second level RDL die assembly 114B is smaller than first level RDL die assembly 114A such that terminals 126 of first level RDL die assembly 114A are exposed facilitating wire bonding thereto with bond wires 128A. In this manner, the first and second dies 118A, 118B, e.g., having the same size, are effectively stacked one upon another without the use of a spacer. Accordingly, the height of stacked RDL die assembly package 100 is minimized.

More particularly, FIG. 1 is a top perspective view of a stacked redistribution layer (RDL) die assembly package 100 in accordance with one embodiment of the present invention. FIG. 2 is a cross-sectional view of stacked RDL die assembly package 100 along the line II-II of FIG. 1.

Referring now to FIGS. 1 and 2 together, stacked RDL die assembly package 100 includes a substrate 102. Substrate 102 includes an upper, e.g., first, surface 102U and a lower, e.g., second, surface 102L, opposite upper surface 102U.

Formed on upper surface 102U of substrate 102 are a plurality of electrically conductive upper, e.g., first, traces 104. Formed on lower surface 102L of substrate 102 are a plurality of electrically conductive lower, e.g., second, traces 106.

Extending through substrate 102 from lower surface 102L to upper surface 102U are a plurality of electrically conductive vias 108. Lower traces 106 are electrically connected to upper traces 104 by vias 108. Upper and lower surfaces 102U, 102L of substrate 102 may include an outermost insulative cover coat, e.g., an epoxy based resin, through which electrically conductive bond fingers, e.g., the end portions, of upper traces 104 and lower traces 106 are exposed.

Formed on lower traces 106 are electrically conductive pads 110. Formed on pads 110 are electrically conductive interconnection balls 112, e.g., solder. Interconnection balls 112 are used to connect stacked RDL die assembly package 100 to a larger substrate such as a printed circuit mother board or another electronic component package.

Although a particular electrically conductive pathway between upper traces 104 and interconnection balls 112 is described above, other electrically conductive pathways can be formed. For example, contact metallizations can be formed between the various electrical conductors. Alternatively, pads 110 are not formed and interconnection balls 112 are formed directly on lower traces 106.

Further, instead of straight though vias 108, in one embodiment, substrate 102 is a multilayer laminate substrate and a plurality of vias and/or internal traces form the electrical interconnection between traces 104 and 106.

In yet another embodiment, interconnection balls 112 are distributed in an array format to form a ball grid array (BGA) type package. Alternatively, interconnection balls 112 are not formed, e.g., to form a metal land grid array (LGA) type package. In yet another alternative, pads 110/interconnection balls 112 are not formed, e.g., to form a leadless chip carrier (LCC) type package. In another embodiment, stacked RDL die assembly package 100 is inserted into a socket that is pre-mounted on the larger substrate, e.g., on the printed circuit mother board. BGA, LGA and LCC type packages are well known to those of skill in the art.

In another embodiment, a flex connector, sometimes called an edge connector or flex strip, is electrically connected to lower traces 106, e.g., for applications where stacked RDL die assembly package 100 is remote from the larger substrate. Other electrically conductive pathway modifications will be obvious to those of skill in the art.

Referring still to FIGS. 1 and 2 together, mounted to upper surface 102U of substrate 102 is a first level RDL die assembly 114A. More particularly, a lower, e.g., first, surface 114L of first level RDL die assembly 114A is mounted to upper surface 102U, for example, with an adhesive 116A. First level RDL die assembly 114A includes a die 118A, a fan out support 120A, and traces 122A, sometimes called first traces.

Die 118A, generally an electronic component, is a semiconductor die, sometimes called an integrated circuit chip or an active component. However, in other embodiments, die 118A is another type of electronic component such as a passive component, e.g., a resistor, capacitor or inductor.

Die 118A includes an upper, e.g., first, surface 118U, a lower, e.g., second, surface 118L and sides 118S extending perpendicularly between upper surface 118U and lower surface 118L. Die 118A further includes bond pads 124 on upper surface 118U of die 118A. Although various structures may be described as being parallel or perpendicular, it is understood that the structures may not be exactly parallel or perpendicular but only substantially parallel or perpendicular to within accepted manufacturing tolerances.

Fan out support 120A encloses sides 118S of die 118A. More particularly, fan out support 120A extends outwardly from sides 118S of die 118A and provides a means for supporting traces 122A. Fan out support 120A is a dielectric material, e.g., molding compound or cured liquid encapsulant.

Fan out support 120A includes an upper, e.g., first, surface 120U, a lower, e.g., second, surface 120L and outer sides 120S extending perpendicularly between upper surface 120U and lower surface 120L. In accordance with this embodiment, upper surface 120U of fan out support 120A is coplanar with upper surface 118U of die 118A, i.e., upper surface 120U and upper surface 118U are parallel to one another and lie in the same plane. Similarly, in accordance with this embodiment, lower surface 120L of fan out support 120A is coplanar with lower surface 118L of die 118A. Stated another way, die 118A and fan out support 120A have the same thickness T.

Traces 122A are electrically connected to bond pads 124 of die 118A. Traces 122A extend outward from bond pads 124 and on to upper surface 120U of fan out support 120A. Generally, traces 122A, sometimes called lines, redistribute and fan out the pattern of bond pads 124 to the pattern of terminals 126 of traces 122A. In one embodiment, terminals 126 are the ends of traces 122A.

Terminals 126 are electrically connected to upper traces 104 by first level bond wires 128A.

Mounted to upper surface 114U of first level RDL die assembly 114A is a second level RDL die assembly 114B. More particularly, a lower, e.g., first, surface 114L of second level RDL die assembly 114B is mounted to upper surface 114U of first level RDL die assembly 114A, for example, with an adhesive 116B. Second level RDL die assembly 114B is substantially similar to first level RDL die assembly 114A and only the significant differences are discussed below. More particularly, second level RDL die assembly 114B includes a die 118B, a fan out support 120B, and traces 122B similar to die 118A, fan out support 120A, and traces 122A, respectively, of first level RDL die assembly 114A.

In accordance with this embodiment, die 118B is the same size as die 118A, although is a different size, e.g. smaller or larger, in other embodiments. More particularly, the total surface area of upper surface 118U of die 118B is equal to the total surface area of upper surface 118U of die 118A. In one embodiment, dies 118A, 118B are identical dies.

Fan out support 120B encloses sides 118S of die 118B. More particularly, fan out support 120B extends outwardly from sides 118S of die 118B and provides a means for supporting traces 122B, sometimes called second traces. In accordance with this embodiment, fan out support 120B of second level RDL die assembly 114B is smaller than fan out support 120A of first level RDL die assembly 114A. More particularly, the total area of upper surface 120U of fan out support 120B is less than the total area of upper surface 120U of fan out support 120A.

As a result, second level RDL die assembly 114B is smaller than first level RDL die assembly 114A. More particularly, the total area of upper surface 114U of first level RDL die assembly 114A is defined by the outer peripheral edge of upper surface 120U of fan out support 120A. The total area of upper surface 114U of first level RDL die assembly 114A equals the combined areas of upper surface 118U of die 118A and upper surface 120U of fan out support 120A.

Similarly, the total area of upper surface 114U of second level RDL die assembly 114B is defined by the outer peripheral edge of upper surface 120U of fan out support 120B. The total area of upper surface 114U of second level RDL die assembly 114B equals the combined areas of upper surface 118U of die 118B and upper surface 120U of fan out support 120B.

As second level RDL die assembly 114B is smaller than first level RDL die assembly 114A, second level RDL die assembly 114B is mounted to first level RDL die assembly 114A inward of terminals 126 of traces 122A of first level RDL die assembly 114A. This facilitates wire bonding to terminals 126 of traces 122A of first level RDL die assembly 114A with first level bond wires 128A as discussed above.

Terminals 126 of traces 122B of second level RDL die assembly 114B are electrically connected to upper traces 104 by second level bond wires 128B.

Mounted to upper surface 114U of second level RDL die assembly 114B is a third level RDL die assembly 114C. More particularly, a lower, e.g., first, surface 114L of third level RDL die assembly 114C is mounted to upper surface 114U of second level RDL die assembly 114B, for example, with an adhesive 116C. Third level RDL die assembly 114C is substantially similar to first and second level RDL die assemblies 114A, 114B and only the significant differences are discussed below. More particularly, third level RDL die assembly 114C includes a die 118C, a fan out support 120C, and traces 122C similar to dies 118A, 118B, fan out supports 120A, 120B, and traces 122A, 122B, respectively, of first and second level RDL die assemblies 114A, 114B.

In accordance with this embodiment, die 118C is the same size as dies 118A, 118B, although is a different size, e.g. smaller or larger, in other embodiments. More particularly, the total surface area of upper surface 118U of die 118C is equal to the total surface area of upper surface 118U of die 118A and is equal to the total surface area of upper surface 118U of die 118B. In one embodiment, dies 118A, 118B, 118C, sometimes called first, second, and third dies, are identical dies.

Fan out support 120C encloses sides 118S of die 118C. More particularly, fan out support 120C extends outwardly from sides 118S of die 118C and provides a means for supporting traces 122C, sometimes called third traces. In accordance with this embodiment, fan out support 120C of third level RDL die assembly 114C is smaller than fan out support 120B of second level RDL die assembly 114B. More particularly, the total area of upper surface 120U of fan out support 120C is less than the total area of upper surface 120U of fan out support 120B.

As a result, third level RDL die assembly 114C is smaller than second level RDL die assembly 114B. More particularly, the total area of upper surface 114U of third level RDL die assembly 114C equals the combined areas of upper surface 118U of die 118C and upper surface 120U of fan out support 120C.

As third level RDL die assembly 114C is smaller than second level RDL die assembly 114B, third level RDL die assembly 114C is mounted to second level RDL die assembly 114B inward of terminals 126 of traces 122B of second level RDL die assembly 114B. This facilitates wire bonding to terminals 126 of traces 122B of second level RDL die assembly 114B with second level bond wires 128B as discussed above.

Terminals 126 of traces 122C of third level RDL die assembly 114C are electrically connected to upper traces 104 by third level bond wires 128C.

In another embodiment, stacked RDL die assembly package 100 is formed without fan out support 120C and traces 122C, i.e., die 118C is mounted to second level RDL die assembly 118B. In accordance with this embodiment, third level wirebonds 128C are directly connected to bond pads 124 of die 118C. In another embodiment, bond pads 124 of die 118C are directly connected to terminals 126 of traces 122A and/or terminals 126 of traces 122B by bond wires.

In another embodiment, terminals 126 of traces 122B are electrically connected to terminals 126 of traces 122A and/or terminals 126 of traces 122C by bond wires. In yet another embodiment, terminals 126 of traces 122C are electrically connected to terminals 126 of traces 122A by bond wires.

Stacked RDL die assembly package 100 further includes an encapsulant 130. Encapsulant 130 is not illustrated in FIG. 1 for clarity of presentation. Encapsulant 130 encloses, sometimes called overmolds, RDL die assemblies 114A, 114B, 114C, bond wires 128A, 128B, 128C and the exposed portion of upper surface 102U of substrate 102 as shown in FIG. 2.

As set forth above, stacked RDL die assembly package 100 includes progressively smaller RDL die assemblies 114A, 114B, 114C, stacked one upon another, sometimes called pyramid stacked. By pyramid stacking RDL die assemblies 114A, 114B, 114C, terminals 126 of each RDL die assembly 114A, 114B, 114C are exposed thus facilitating wire bonding thereto, i.e., with bond wires 128A, 128B, 128C, respectively. Further, same size dies 118A, 118B, 118C are effectively stacked one upon another without the use of a spacer. Accordingly, the height of stacked RDL die assembly package 100 is minimized.

As set forth above, stacked RDL die assembly package 100 includes three RDL die assemblies 114A, 114B, 114C. However, in other embodiments, a stacked RDL die assembly package includes two RDL die assemblies or more than three RDL die assemblies, e.g., five RDL die assemblies, similar to RDL die assemblies 114A, 114B, and/or 114C.

As set forth above, lower surfaces 120L of fan out supports 120A, 120B, 120C, sometimes called first, second, and third fan out supports, are coplanar with lower surfaces 114L of dies 118A, 118B 118C, respectively, such that lower surfaces 114L are exposed. Stated another way, each fan out support 120A, 120B, 120C and each die 118A, 118B, 118C has a thickness T. However, in another embodiment, a stacked RDL die assembly package is fabricated with one or more RDL die assemblies in which the fan out support entirely encloses the lower surface of the die. An example of such a RDL die assembly is set forth below in reference to FIG. 3.

Figure 3:
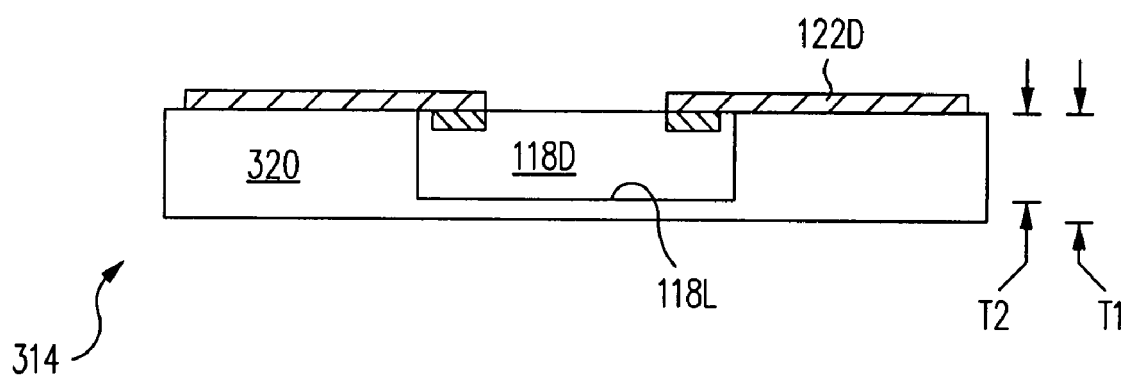
FIG. 3 is a cross-sectional view of a RDL die assembly for use in a stacked RDL die assembly package in accordance with one embodiment of the present invention.

FIG. 3 is a cross-sectional view of a RDL die assembly 314 for use in a stacked RDL die assembly package in accordance with one embodiment of the present invention. Referring now to FIG. 3, RDL die assembly 314 includes a die 118D, a fan out support 320, and traces 122D. In accordance with this embodiment, fan out support 320 has a first thickness T1 greater than a second thickness T2 of die 118D such that fan out support 320 entirely encloses lower surface 118L of die 118D.

Figure 4:
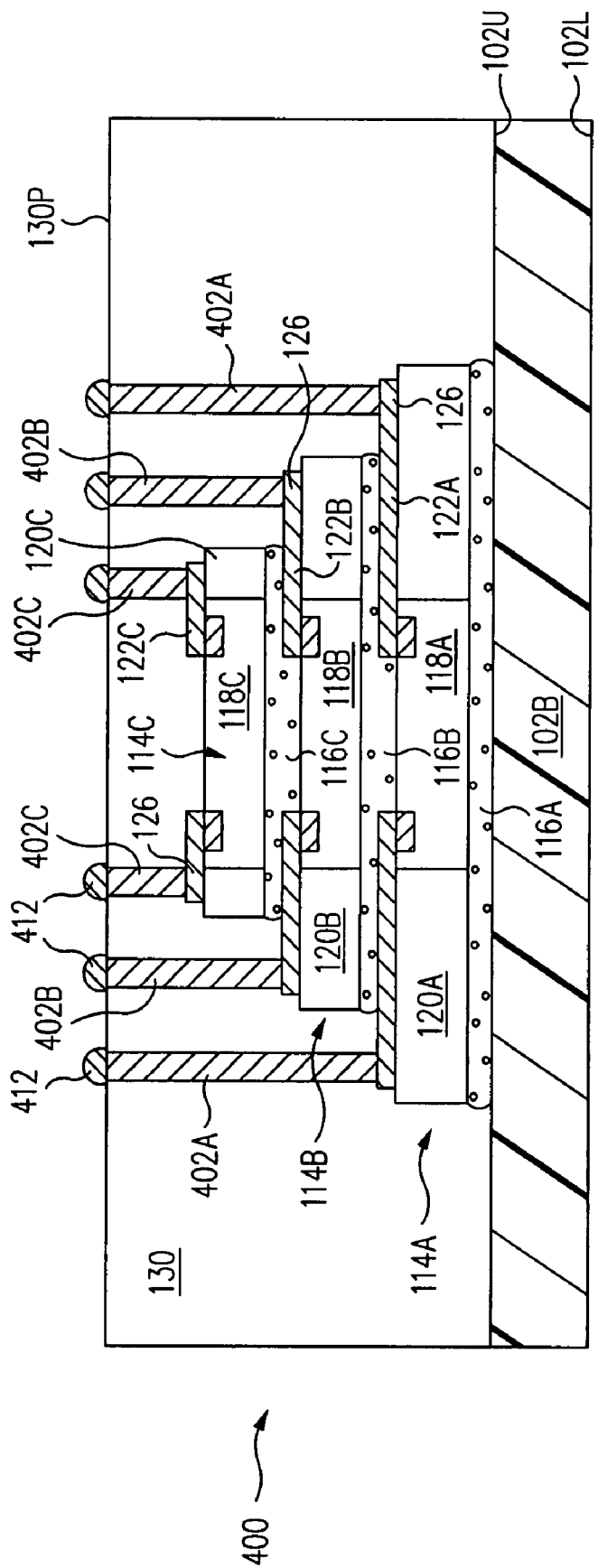
FIGS. 4, 5, 6, 7, 8, 9, 10, 11, 12 are cross-sectional views of stacked RDL die assembly packages in accordance with other embodiments of the present invention.

FIG. 4 is a cross-sectional view of a stacked RDL die assembly package 400 in accordance with another embodiment of the present invention. Stacked RDL die assembly package 400 of FIG. 4 is similar to stacked RDL die assembly package 100 of FIGS. 1, 2 and only the significant differences between stacked RDL die assembly package 400 and stacked RDL die assembly package 100 are discussed below.

Referring now to FIG. 4, in accordance with this embodiment, electrically conductive vias 402A, 402B, 402C are formed in encapsulant 130 and are electrically connected to terminals 126 of traces 122A, 122B, 122C of first, second, and third level RDL die assemblies 114A, 114B, 114C, respectively. Vias 402A, 402B, 402C, collectively vias 402, extend from terminals 126 to a principal surface 130P of encapsulant 130. In accordance with this embodiment, interconnection balls 412 are formed on the ends of vias 402 at principal surface 130P of encapsulant 130.

In accordance with one embodiment, to form stacked RDL die assembly package 400, after mounting of first, second, third level RDL die assemblies 114A, 114B, 114C to a substrate 102B in a manner similar to that discussed above, encapsulant 130 is formed. Via holes are formed, e.g., by chemical etching, mechanical drilling, and/or laser ablation, through encapsulant 130 to exposed terminals 126. The via holes are filled with electrically conductive material, e.g., by plating, to form vias 402. Interconnection balls 412 are then formed on the ends of vias 402.

Figure 5:
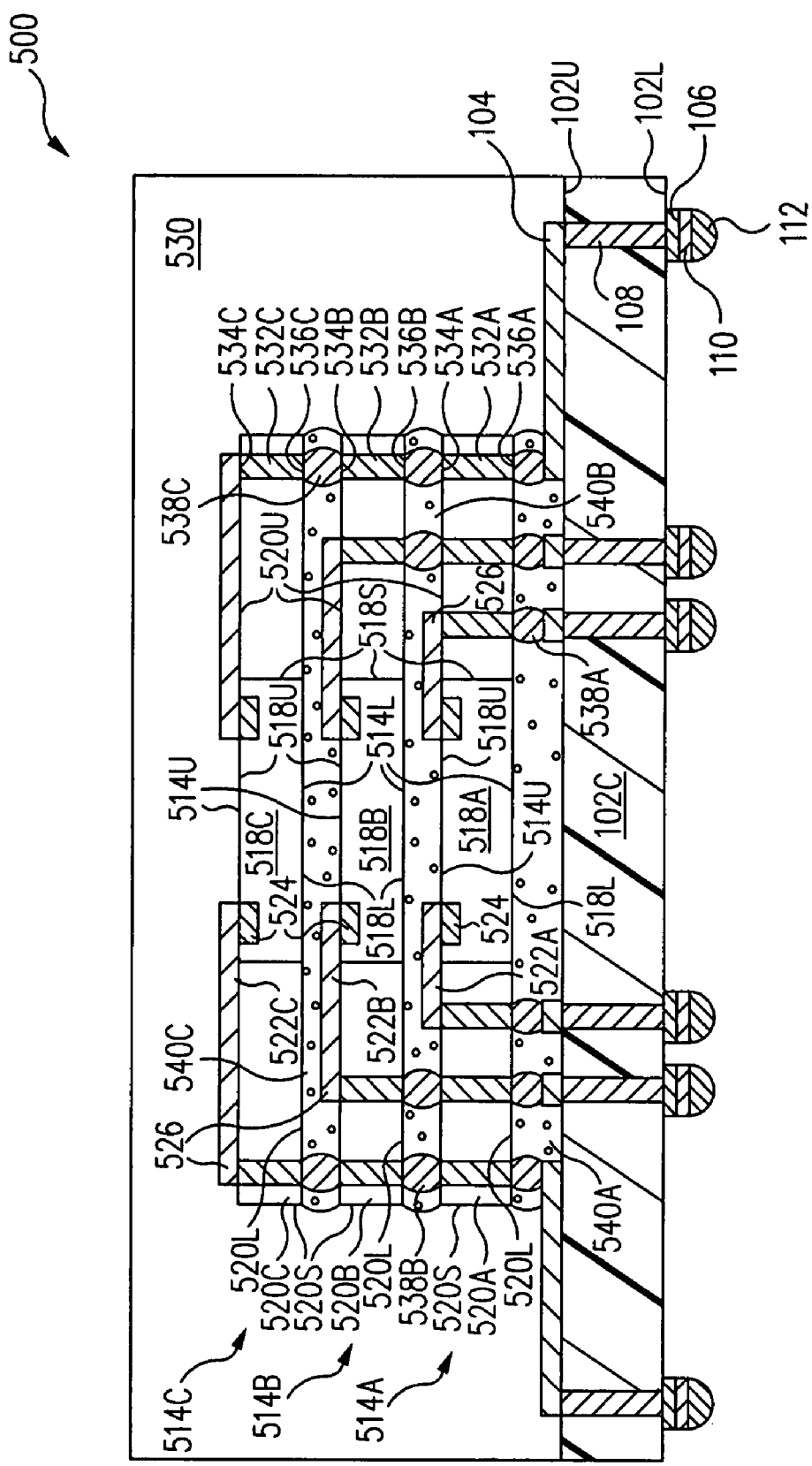

FIG. 5 is a cross-sectional view of a stacked RDL die assembly package 500 in accordance with another embodiment of the present invention. Stacked RDL die assembly package 500 of FIG. 5 is similar to stacked RDL die assembly package 100 of FIGS. 1, 2 and only the significant differences between stacked RDL die assembly package 500 and stacked RDL die assembly package 100 are discussed below.

Referring now to FIG. 5, stacked RDL die assembly package 500 includes a first level RDL die assembly 514A, a second level RDL die assembly 514B, and a third level RDL die assembly 514C.

First level RDL die assembly 514A includes a die 518A, a fan out support 520A, traces 522A, and electrically conductive vias 532A.

Die 518A includes an upper, e.g., first, surface 518U, a lower, e.g., second, surface 518L and sides 518S extending perpendicularly between upper surface 518U and lower surface 518L. Die 518A further includes bond pads 524 on upper surface 518U of die 518A.

Fan out support 520A encloses sides 518S of die 518A. More particularly, fan out support 520A extends outwardly from sides 518S of die 518A and provides a support for traces 522A. Fan out support 520A is a dielectric material, e.g., molding compound or cured liquid encapsulant.

Fan out support 520A includes an upper, e.g., first, surface 520U, a lower, e.g., second, surface 520L and outer sides 520S extending perpendicularly between upper surface 520U and lower surface 520L.

Traces 522A are electrically connected to bond pads 524 of die 518A. Traces 522A extend outward from bond pads 524 and on to upper surface 520U of fan out support 520A. Generally, traces 522A, sometimes called lines, redistribute and fan out the pattern of bond pads 524 to the pattern of terminals 526 of traces 522A. In one embodiment, terminals 526 are the ends of traces 522A.

Electrically conductive vias 532A extend through fan out support 520A and between upper surface 520U and lower surface 520L of fan out support 520A. In accordance with this embodiment, the upper, e.g., first, ends of vias 532A at upper surface 520U form upper lands 534A for first level RDL die assembly 514A. Similarly, the lower, e.g., second, ends of vias 532A at lower surface 520L form lower lands 536A for first level RDL die assembly 514A.

Lower lands 536A are electrically connected to upper traces 104 of substrate 102C by electrically conductive bumps 538A. Illustratively, electrically conductive bumps 538A are solder, electrically conductive adhesive, or other electrically conductive material.

Further, bumps 538A mount first level RDL die assembly 514A to substrate 102C. Optionally, an underfill 540A is applied between lower surface 514L of first level RDL die assembly 514A and upper surface 102U of a substrate 102C. Underfill 540A encloses bumps 538A.

Upper lands 534A of first level RDL die assembly 514A are electrically connected to traces 522A of first level RDL die assembly 514A and/or to lower lands 536B of second level RDL die assembly 514B as discussed further below.

Second and third level RDL die assemblies 514B, 514C are similar to first level RDL die assembly 514A and so are only discussed briefly.

Second level RDL die assembly 514B includes a die 518B, a fan out support 520B, traces 522B, and electrically conductive vias 532B including upper lands 534B and lower lands 536B.

Lower lands 536B are electrically connected to upper lands 534A of first level RDL die assembly 514A by electrically conductive bumps 538B. Further, bumps 538B mount second level RDL die assembly 514B to first level RDL die assembly 514A. Optionally, an underfill 540B is applied between lower surface 514L of second level RDL die assembly 514B and upper surface 514U of first level RDL die assembly 514A. Underfill 540B encloses bumps 538B.

Upper lands 534B of second level RDL die assembly 514B are electrically connected to traces 522B of second level RDL die assembly 514B and/or to lower lands 536C of third level RDL die assembly 514C as discussed further below.

Third level RDL die assembly 514C includes a die 518C, a fan out support 520C, traces 522C, and electrically conductive vias 532C including upper lands 534C and lower lands 536C.

Lower lands 536C are electrically connected to upper lands 534B of second level RDL die assembly 514B by electrically conductive bumps 538C. Further, bumps 538C mount third level RDL die assembly 514C to second level RDL die assembly 514B. Optionally, an underfill 540C is applied between lower surface 514L of third level RDL die assembly 514C and upper surface 514U of second level RDL die assembly 514B. Underfill 540C encloses bumps 538C.

Upper lands 534C of third level RDL die assembly 514C are electrically connected to traces 522C of third level RDL die assembly 514C.

Stacked RDL die assembly package 500 further includes an encapsulant 530. Encapsulant 530 encloses RDL die assemblies 514A, 514B, 514C and the exposed portion of upper surface 102U of substrate 102C.

As set forth above, stacked RDL die assembly package 500 includes RDL die assemblies 514A, 514B, 514C, e.g., which are the same size, stacked one upon another. Accordingly, dies 518A, 518B, 518C, e.g., which are the same size, are effectively stacked one upon another without the use of a spacer. Accordingly, the height of stacked RDL die assembly package 500 is minimized.

As set forth above, stacked RDL die assembly package 500 includes three RDL die assemblies 514A, 514B, 514C. However, in other embodiments, a stacked RDL die assembly package includes two RDL die assemblies or more than three RDL die assemblies, e.g., five RDL die assemblies, similar to RDL die assemblies 514A, 514B, and/or 514C.

Figure 6:
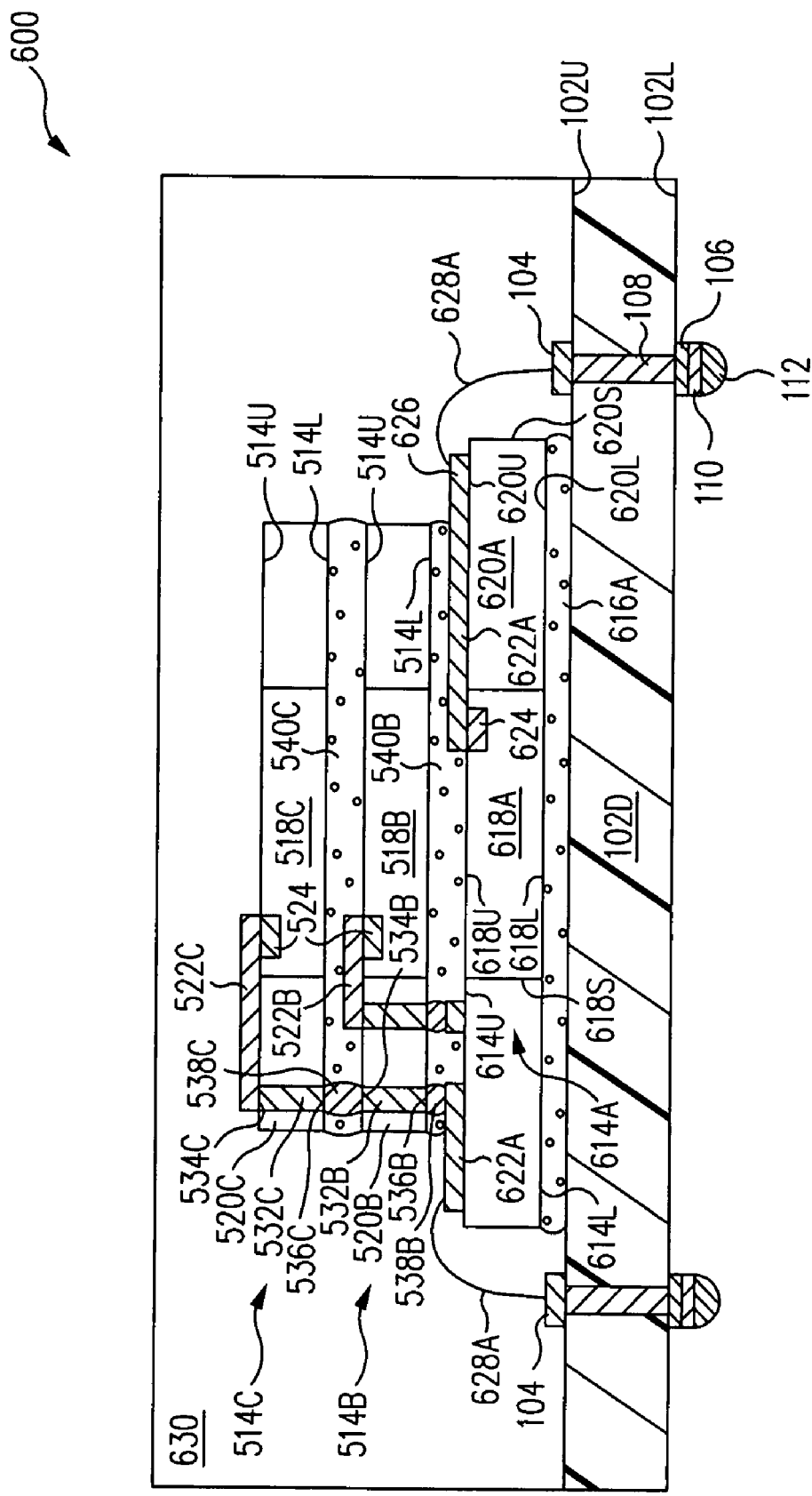

FIG. 6 is a cross-sectional view of a stacked RDL die assembly package 600 in accordance with another embodiment of the present invention.

Referring now to FIG. 6, a first level RDL die assembly 614A is mounted to upper surface 102U of a substrate 102D. More particularly, a lower, e.g., first, surface 614L of first level RDL die assembly 614A is mounted to upper surface 102U, for example, with an adhesive 616A. First level RDL die assembly 614A includes a die 618A, a fan out support 620A, and traces 622A.

Die 618A includes an upper, e.g., first, surface 618U, a lower, e.g., second, surface 618L and sides 618S extending perpendicularly between upper surface 618U and lower surface 618L. Die 618A further includes bond pads 624 on upper surface 618U of die 618A.

Fan out support 620A encloses sides 618S of die 618A. More particularly, fan out support 620A extends outwardly from sides 618S of die 618A and provides a support for traces 622A. Fan out support 620A is a dielectric material, e.g., molding compound or cured liquid encapsulant.

Fan out support 620A includes an upper, e.g., first, surface 620U, a lower, e.g., second, surface 620L and outer sides 620S extending perpendicularly between upper surface 620U and lower surface 620L.

A first subset of traces 622A is electrically connected to bond pads 624 of die 618A.

A second subset of traces 622A are formed only on upper surface 620U of fan out support 620A. This second subset of traces 622A are electrically connected to lower lands 536B of second level RDL die assembly 514B.

Traces 622A further include terminals 626. In one embodiment, terminals 626 are the ends of traces 622A. Terminals 626 are electrically connected to upper traces 104 by first level bond wires 628A.

Stacked RDL die assembly package 600 further includes second and third level RDL die assemblies 514B, 514C. Second and third level RDL die assemblies 514B, 514C of stacked RDL die assembly package 600 are substantially similar to second and third level RDL die assemblies 514B, 514C of stacked RDL die assembly package 500 of FIG. 5 and so are only briefly discussed.

Referring now FIG. 6, lower lands 536B of second level RDL die assembly 514B are electrically connected to traces 622A, e.g., the inner ends, sometimes called lands, of first level RDL die assembly 614A by electrically conductive bumps 538B. Further, bumps 538B mount second level RDL die assembly 514B to first level RDL die assembly 614A. Optionally, an underfill 540B is applied between lower surface 514L of second level RDL die assembly 514B and upper surface 614U of first level RDL die assembly 614A. Underfill 540B encloses bumps 538B.

In accordance with this embodiment, die 518B is the same size as die 618A, although is a different size, e.g. smaller or larger, in other embodiments. However, fan out support 520B of second level RDL die assembly 514B is smaller than fan out support 620A of first level RDL die assembly 614A. As a result, second level RDL die assembly 514B is smaller than first level RDL die assembly 614A.

As second level RDL die assembly 514B is smaller than first level RDL die assembly 614A, second level RDL die assembly 514B is mounted to first level RDL die assembly 614A inward of terminals 626 of traces 622A of first level RDL die assembly 614A. This facilitates wire bonding to terminals 626 of traces 622A of first level RDL die assembly 614A with first level bond wires 628A as discussed above.

Third level RDL die assembly 514C is electrically connected and mounted to second level RDL die assembly 514B using bumps 538C and, optionally, underfill 540C, as discussed above in reference to stacked RDL die assembly package 500 of FIG. 5, and so is not repeated here. Third level RDL die assembly 514C and die 518C are the same size as second level RDL die assembly 514B and die 518B, respectively, in this embodiment.

Stacked RDL die assembly package 600 further includes an encapsulant 630. Encapsulant 630 encloses RDL die assemblies 614A, 514B, 514C, bond wires 628A, and the exposed portion of upper surface 102U of substrate 102D.

As set forth above, stacked RDL die assembly package 600 includes three RDL die assemblies 614A, 514B, 514C. However, in other embodiments, a stacked RDL die assembly package includes two RDL die assemblies or more than three RDL die assemblies, e.g., five RDL die assemblies, similar to RDL die assemblies 614A, 514B, 514C. For example, a stacked RDL die assembly package includes RDL die assembly 614A, three RDL die assemblies 514B stacked on RDL die assembly 614A, and RDL die assembly 514C stacked on the three RDL die assemblies 514B.

Figure 7:
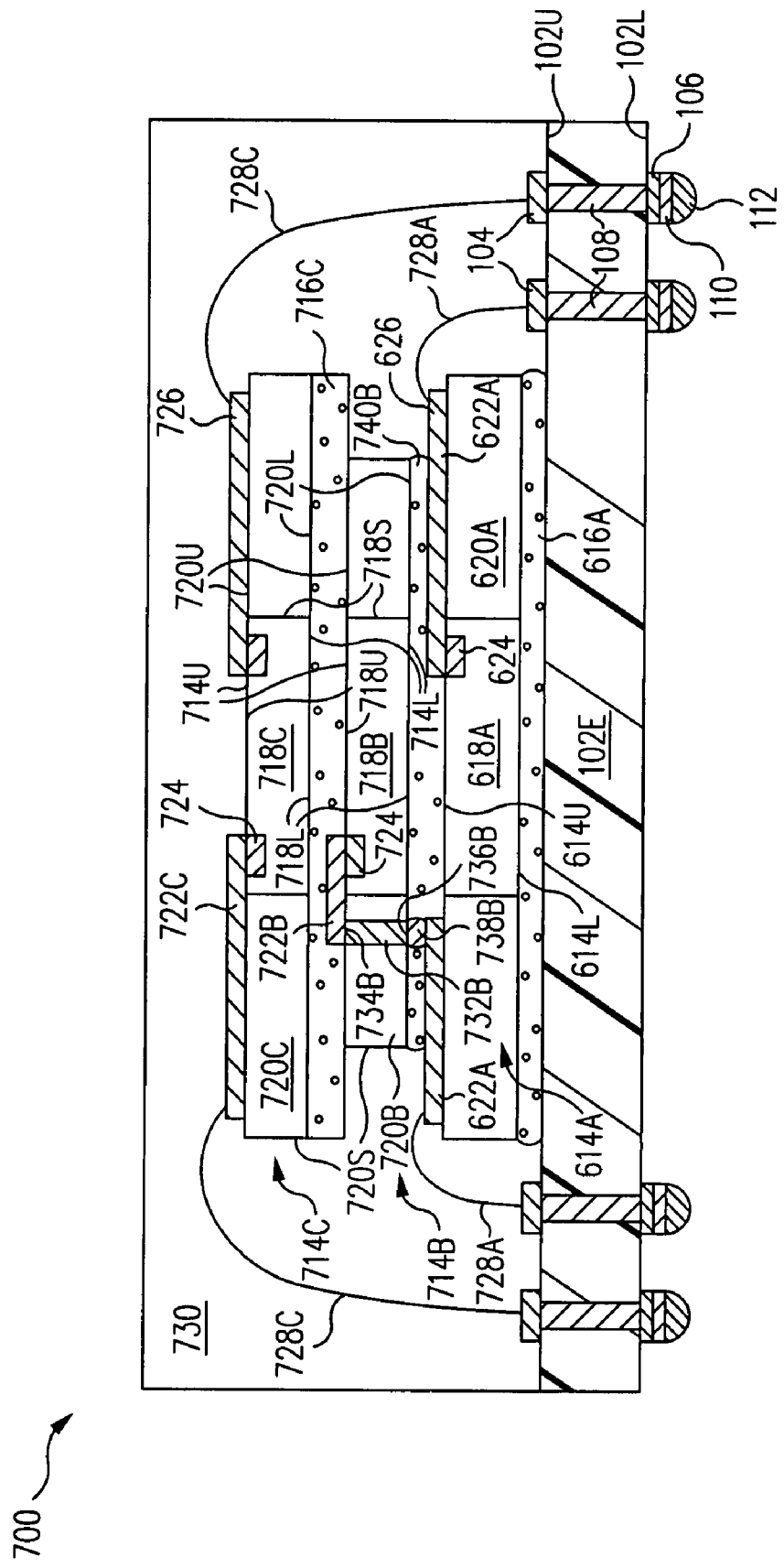

FIG. 7 is a cross-sectional view of a stacked RDL die assembly package 700 in accordance with another embodiment of the present invention. Referring now to FIG. 7, first level RDL die assembly 614A is mounted to upper surface 102U of a substrate 102E with an adhesive 616A.

Stacked RDL die assembly package 700 further includes second and third level RDL die assemblies 714B, 714C. Second level RDL die assembly 714B includes a die 718B, a fan out support 720B, traces 722B, and electrically conductive vias 732B including upper lands 734B and lower lands 736B.

Die 718B includes an upper, e.g., first, surface 718U, a lower, e.g., second, surface 718L and sides 718S extending perpendicularly between upper surface 718U and lower surface 718L. Die 718B further includes bond pads 724 on upper surface 718U of die 718B.

Fan out support 720B encloses sides 718S of die 718B. More particularly, fan out support 720B extends outwardly from sides 718S of die 718B and provides a support for traces 722B. Fan out support 720B is a dielectric material, e.g., molding compound or cured liquid encapsulant.

Fan out support 720B includes an upper, e.g., first, surface 720U, a lower, e.g., second, surface 720L and outer sides 720S extending perpendicularly between upper surface 720U and lower surface 720L.

Traces 722B are electrically connected to bond pads 724 of die 718B. Traces 722B extend outward from bond pads 724 and on to upper surface 720U of fan out support 720B.

Electrically conductive vias 732B extend through fan out support 720B and between upper surface 720U and lower surface 720L of fan out support 720B. In accordance with this embodiment, the upper, e.g., first, ends of vias 732B at upper surface 720U form upper lands 734B for second level RDL die assembly 714B. Similarly, the lower, e.g., second, ends of vias 732B at lower surface 720L form lower lands 736B for second level RDL die assembly 714B.

Lower lands 736B are electrically connected to traces 622A of first level RDL die assembly 614A by electrically conductive bumps 738B. Further, bumps 738B mount second level RDL die assembly 714B to first level RDL die assembly 614A. Optionally, an underfill 740B is applied between lower surface 714L of second level RDL die assembly 714B and upper surface 614U of first level RDL die assembly 614A. Underfill 740B encloses bumps 738B.

Upper lands 734B of second level RDL die assembly 714B are electrically connected to traces 722B of second level RDL die assembly 714B.

In accordance with this embodiment, die 718B is the same size as die 618A, although is a different size, e.g. smaller or larger, in other embodiments. However, fan out support 720B of second level RDL die assembly 714B is smaller than fan out support 620A of first level RDL die assembly 614A. As a result, second level RDL die assembly 714B is smaller than first lvel RDL die assembly 614A.

As second level RDL die assembly 714B is smaller than first level RDL die assembly 614A, second level RDL die assembly 714B is mounted to first level RDL die assembly 614A inward of terminals 626 of traces 622A of first level RDL die assembly 614A. This facilitates wire bonding to terminals 626 of traces 622A of first level RDL die assembly 614A with first level bond wires 728A.

Mounted to upper surface 714U of second level RDL die assembly 714B is third level RDL die assembly 714C. More particularly, a lower, e.g., first, surface 714L of third level RDL die assembly 714C is mounted to upper surface 714U of second level RDL die assembly 714B, for example, with an adhesive 716C. In one embodiment, adhesive 716C entirely covers lower surface 714L of third level RDL die assembly 714C. In another embodiment, adhesive 716C entirely covers upper surface 714U of second level RDL die assembly 714B and only partially covers lower surface 714L of third level RDL die assembly 714C.

Third level RDL die assembly 714C includes a die 718C, a fan out support 720C, and traces 722C. Die 718C includes an upper, e.g., first, surface 718U, a lower, e.g., second, surface 718L and sides 718S extending perpendicularly between upper surface 718U and lower surface 718L. Die 718C further includes bond pads 724 on upper surface 718U of die 718C.

Fan out support 720C encloses sides 718S of die 718C. More particularly, fan out support 720C extends outwardly from sides 718S of die 718C and provides a support for traces 722C. Fan out support 720C is a dielectric material, e.g., molding compound or cured liquid encapsulant.

Fan out support 720C includes an upper, e.g., first, surface 720U, a lower, e.g., second, surface 720L and sides 720S extending perpendicularly between upper surface 720U and lower surface 720L.

Traces 722C are electrically connected to bond pads 724 of die 718C. Traces 722C extend outward from bond pads 724 and on to upper surface 720U of fan out support 720C. In one embodiment, terminals 726 are the ends of traces 722C. Terminals 726 are electrically connected to upper traces 104 by third level bond wires 728C.

Stacked RDL die assembly package 700 further includes an encapsulant 730. Encapsulant 730 encloses RDL die assemblies 614A, 714B, 714C, bond wires 728A, 728C and the exposed portion of upper surface 102U of substrate 102E.

In accordance with this embodiment, third level RDL die assembly 714C is the same size as first level RDL die assembly 614A, although is a greater size or a smaller size in other embodiments. However, second level RDL assembly 714B spaces lower surface 714L of third level RDL die assembly 714C above first level bond wires 728A. This facilitates wire bonding to terminals 626 of first level RDL assembly 614A with first level bond wires 728A as discussed above.

As set forth above, stacked RDL die assembly package 700 includes three RDL die assemblies 614A, 714B, 714C. However, in other embodiments, a stacked RDL die assembly package includes two RDL die assemblies or more than three RDL die assemblies, e.g., five RDL die assemblies, similar to RDL die assemblies 614A, 714B, 714C. For example, a stacked RDL die assembly package includes RDL die assembly 614A, RDL die assembly 714B stacked on RDL die assembly 614A, RDL die assembly 614A stacked on RDL die assembly 714B, RDL die assembly 714B stacked on RDL die assembly 614A, and RDL die assembly 714C stacked on RDL die assembly 714B, for a total of five stacked RDL die assemblies 614A, 714B, 614A, 714B, 714C.

Figure 8:
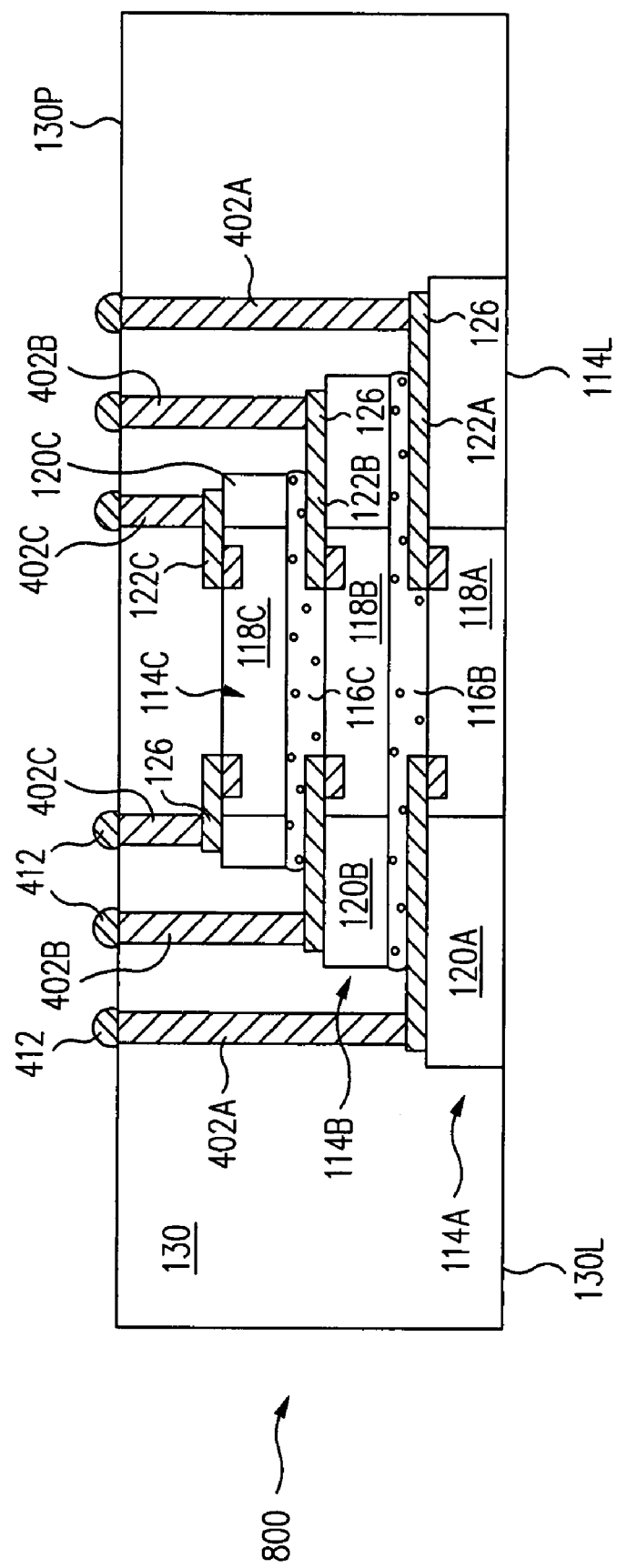

FIG. 8 is a cross-sectional view of a stacked RDL die assembly package 800 in accordance with another embodiment of the present invention. Stacked RDL die assembly package 800 of FIG. 8 is similar to stacked RDL die assembly package 400 of FIG. 4 and only the significant differences between stacked RDL die assembly package 800 and stacked RDL die assembly package 400 are discussed below.

Referring now to FIG. 8, a lower, e.g., first, surface 130L of encapsulant 130 is substantially coplanar with lower surface 114L of first level RDL die assembly 114A. Stated another way, lower surface 114L of first level RDL die assembly 114A is exposed from encapsulant 130.

Figure 9:
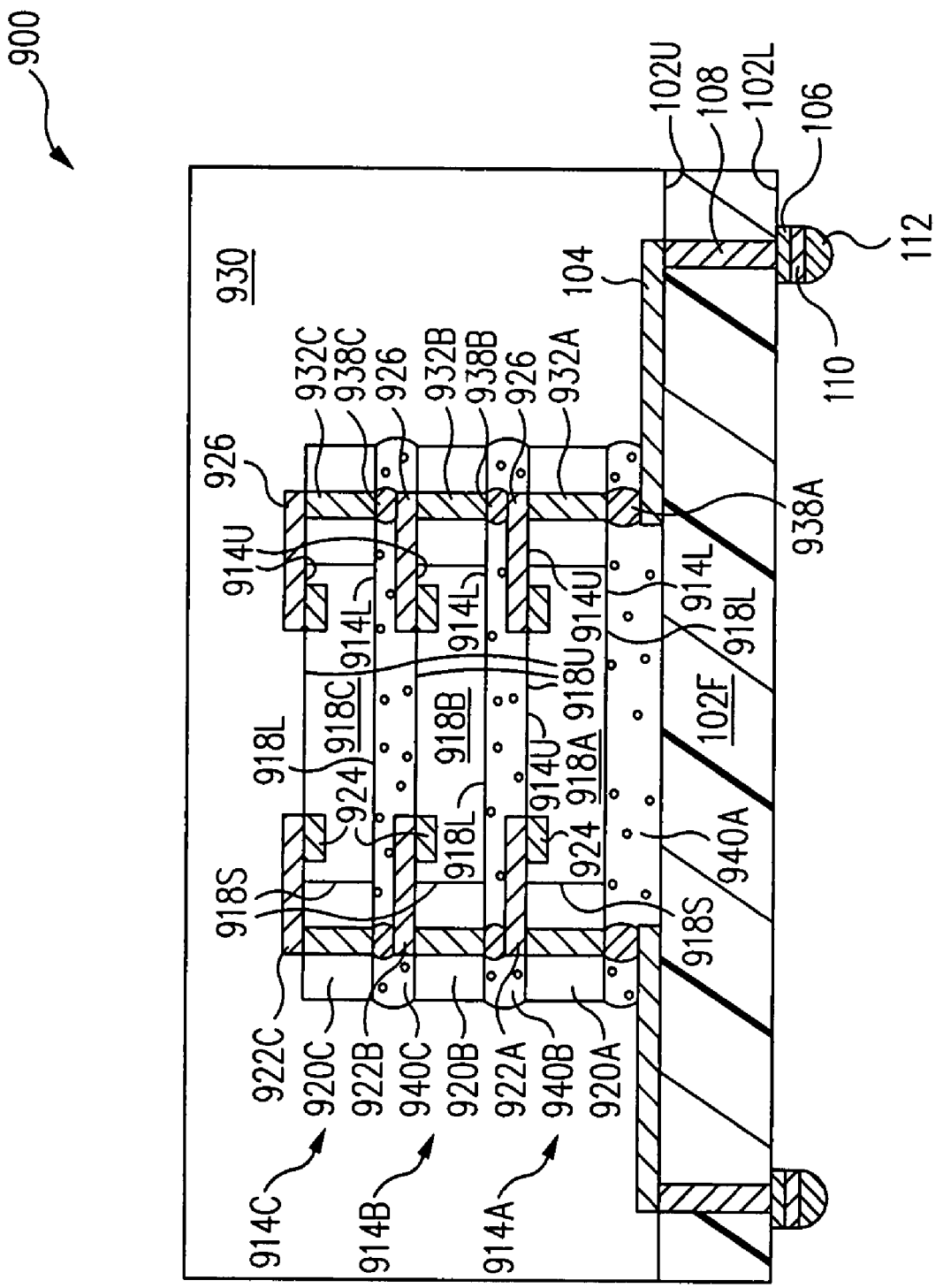

FIG. 9 is a cross-sectional view of a stacked RDL die assembly package 900 in accordance with another embodiment of the present invention. Stacked RDL die assembly package 900 of FIG. 9 is similar to stacked RDL die assembly package 100 of FIGS. 1, 2 and only the significant differences between stacked RDL die assembly package 900 and stacked RDL die assembly package 100 are discussed below.

Referring now to FIG. 9, stacked RDL die assembly package 900 includes a first level RDL die assembly 914A, a second level RDL die assembly 914B, and a third level RDL die assembly 914C.

First level RDL die assembly 914A includes a die 918A, a fan out support 920A, traces 922A, and electrically conductive vias 932A.

Die 918A includes an upper, e.g., first, surface 918U, a lower, e.g., second, surface 918L and sides 918S extending perpendicularly between upper surface 918U and lower surface 918L. Die 918A further includes bond pads 924 on upper surface 918U of die 918A.

Fan out support 920A encloses sides 918S of die 918A. More particularly, fan out support 920A extends outwardly from sides 918S of die 918A and provides a support for traces 922A. Fan out support 920A is a dielectric material, e.g., molding compound or cured liquid encapsulant.

Fan out support 920A includes an upper, e.g., first, surface, a lower, e.g., second, surface and outer sides extending perpendicularly between the upper surface and the lower surface.

Traces 922A are electrically connected to bond pads 924 of die 918A. Traces 922A extend outward from bond pads 924 and on to the upper surface of fan out support 920A. Generally, traces 922A, sometimes called lines, redistribute and fan out the pattern of bond pads 924 to the pattern of terminals 926 of traces 922A. In one embodiment, terminals 926 are the ends of traces 922A.

Electrically conductive vias 932A extend through fan out support 920A and between the upper surface and the lower surface of fan out support 920A. The upper ends, e.g., lands, of vias 932A are electrically connected to traces 922A. The lower ends, e.g., lands, of vias 932A are electrically connected to upper traces 104 of a substrate 102F by electrically conductive bumps 938A. Illustratively, electrically conductive bumps 938A are solder, electrically conductive adhesive, or other electrically conductive material.

Further, bumps 938A mount first level RDL die assembly 914A to substrate 102F. Optionally, an underfill 940A is applied between lower surface 914L of first level RDL die assembly 914A and upper surface 102U of a substrate 102F. Underfill 940A encloses bumps 938A.

Second and third level RDL die assemblies 914B, 914C are similar to first level RDL die assembly 914A and so are only discussed briefly.

Second level RDL die assembly 914B includes a die 918B, a fan out support 920B, traces 922B, and electrically conductive vias 932B.

The lower ends, e.g., lands, of vias 932B are electrically connected to traces 922A of first level RDL die assembly 914A by electrically conductive bumps 938B. Further, bumps 938B mount second level RDL die assembly 914B to first level RDL die assembly 914A. Optionally, an underfill 940B is applied between lower surface 914L of second level RDL die assembly 914B and upper surface 914U of first level RDL die assembly 914A. Underfill 940B encloses bumps 938B.

The upper ends, e.g., lands, of vias 932B of second level RDL die assembly 914B are electrically connected to traces 922B of second level RDL die assembly 914B.

Third level RDL die assembly 914C includes a die 918C, a fan out support 920C, traces 922C, and electrically conductive vias 932C.

The lower ends, e.g., lands, of vias 932C are electrically connected to traces 922B of second level RDL die assembly 914B by electrically conductive bumps 938C. Further, bumps 938C mount third level RDL die assembly 914C to second level RDL die assembly 914B. Optionally, an underfill 940C is applied between lower surface 914L of third level RDL die assembly 914C and upper surface 914U of second level RDL die assembly 914B. Underfill 940C encloses bumps 938C.

The upper ends, e.g., lands, of vias 932C of third level RDL die assembly 914C are electrically connected to traces 922C of third level RDL die assembly 914C.

Stacked RDL die assembly package 900 further includes an encapsulant 930. Encapsulant 930 encloses RDL die assemblies 914A, 914B, 914C and the exposed portion of upper surface 102U of substrate 102F.

As set forth above, stacked RDL die assembly package 900 includes RDL die assemblies 914A, 914B, 914C, e.g., which are the same size, stacked one upon another. Accordingly, dies 918A, 918B, 918C, e.g., which are the same size, are effectively stacked one upon another without the use of a spacer. Accordingly, the height of stacked RDL die assembly package 900 is minimized.

As set forth above, stacked RDL die assembly package 900 includes three RDL die assemblies 914A, 914B, 914C. However, in other embodiments, a stacked RDL die assembly package includes two RDL die assemblies or more than three RDL die assemblies, e.g., five RDL die assemblies, similar to RDL die assemblies 914A, 914B, and/or 914C.

In one embodiment, bond pads 924, sometimes called I/O (input/output) pads, of dies 918A, 918B, 918C are electrically connected to one another as set forth above. Illustratively, dies 918A, 918B, 918C are memory dies where all, or almost all, of bond pads 924 of dies 918A, 918B, 918C are common and thus connected together. In one embodiment, common signal pins for dies 918A, 918B, 918C are formed by bumps 938A, 938B, 938C and electrically conductive vias 932A, 932B, 932C.

Figure 10:
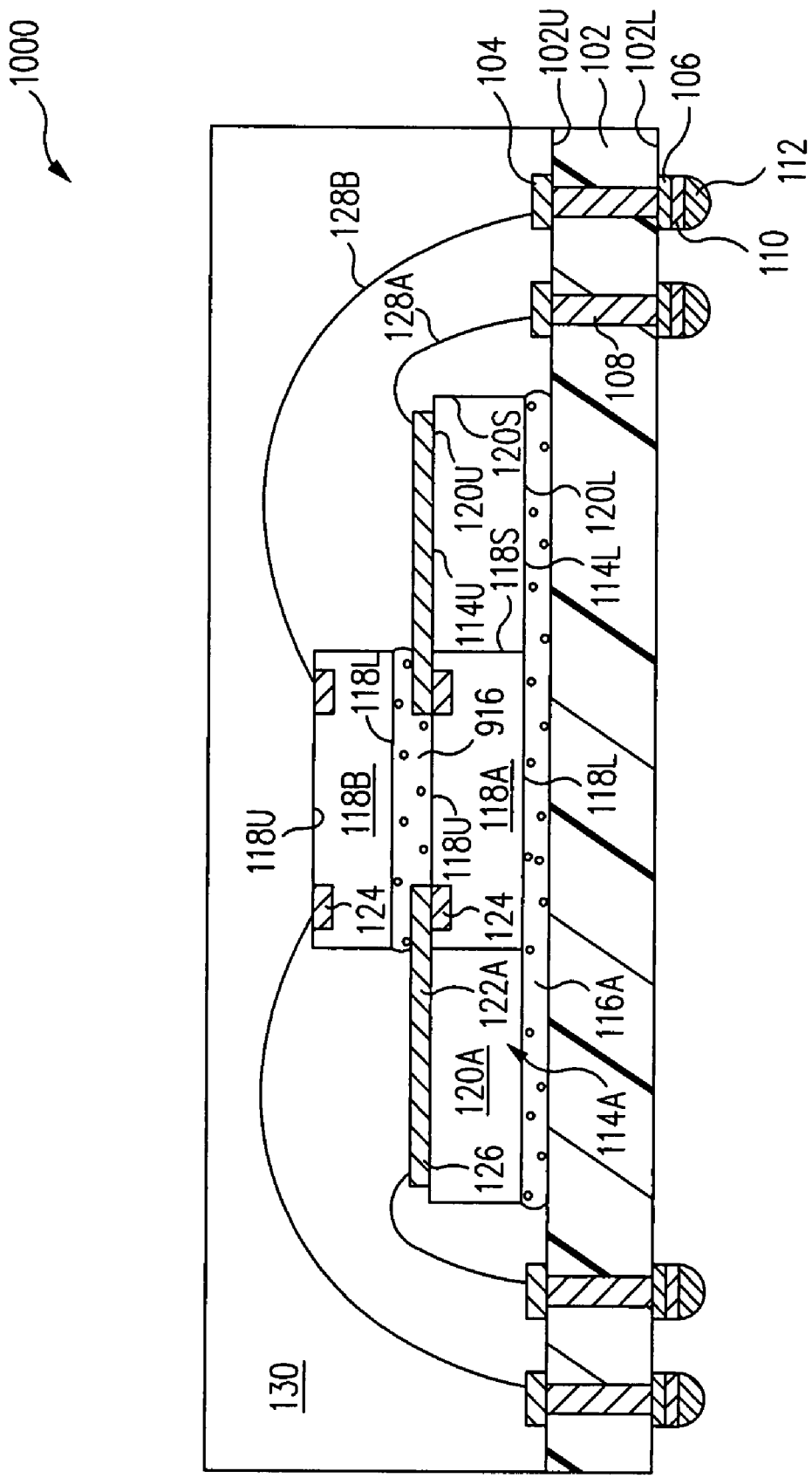

FIG. 10 is a cross-sectional view of a stacked RDL die assembly package 1000 in accordance with another embodiment of the present invention. Stacked RDL die assembly package 1000 of FIG. 10 is similar to stacked RDL die assembly package 100 of FIGS. 1, 2 and only the significant differences between stacked RDL die assembly package 1000 and stacked RDL die assembly package 100 are discussed below.

In accordance with this embodiment, lower surface 118L of die 118B is mounted to upper surface 114U of first level RDL die assembly 114A with adhesive 916. Bond pads 124 of die 118B are electrically connected to corresponding upper traces 104 by second level bond wires 128B.

Encapsulant 130 encloses RDL die assembly 114A, die 118B, bond wires 128A, 128B, and the exposed portion of upper surface 102U of substrate 102 as shown in FIG. 10.

Figure 11:
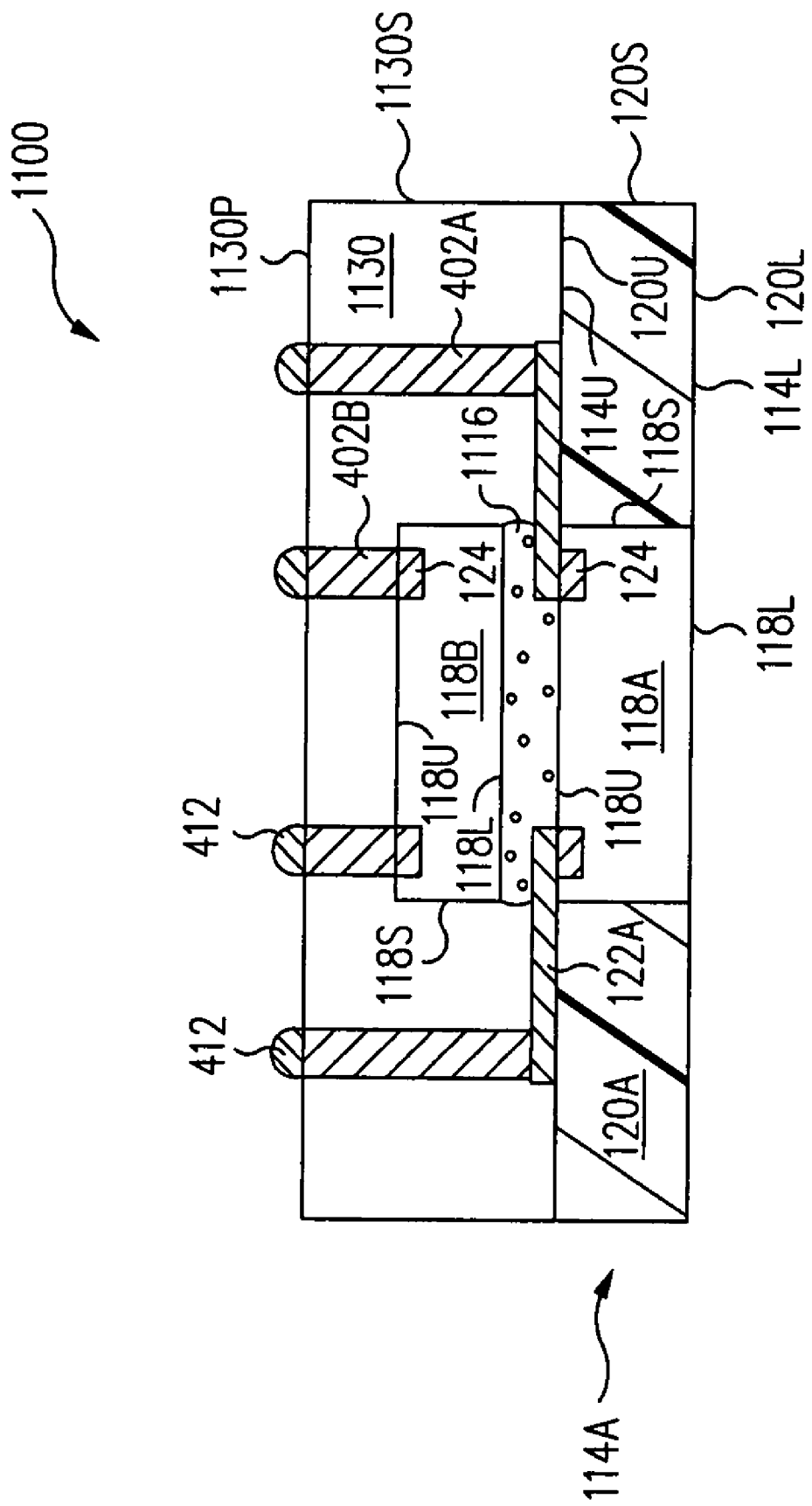

FIG. 11 is a cross-sectional view of a stacked RDL die assembly package 1100 in accordance with another embodiment of the present invention. Stacked RDL die assembly package 1100 of FIG. 11 is similar to stacked RDL die assembly package 400 of FIG. 4 and only the significant differences between stacked RDL die assembly package 1100 and stacked RDL die assembly package 400 are discussed below.

Referring now to FIG. 11, in accordance with this embodiment, lower surface 118L of die 118B is mounted to upper surface 114U of first level RDL die assembly 114A with adhesive 1116.

Electrically conductive vias 402B are formed in an encapsulant 1130 and are electrically connected to bond pads 124 of die 118B. Vias 402B extend from bond pads 124 of die 118B to a principal surface 1130P of encapsulant 1130. In accordance with this embodiment, interconnection balls 412 are formed on the ends of vias 402B at principal surface 1130P of encapsulant 1130.

Encapsulant 1130 encloses upper surface 114U of RDL die assembly 114A and die 118B as shown in FIG. 11. Encapsulant 1130 has sides 1130S substantially coplanar with sides 120S of fan out support 120A of first level RDL die assembly 114A.

Figure 12:
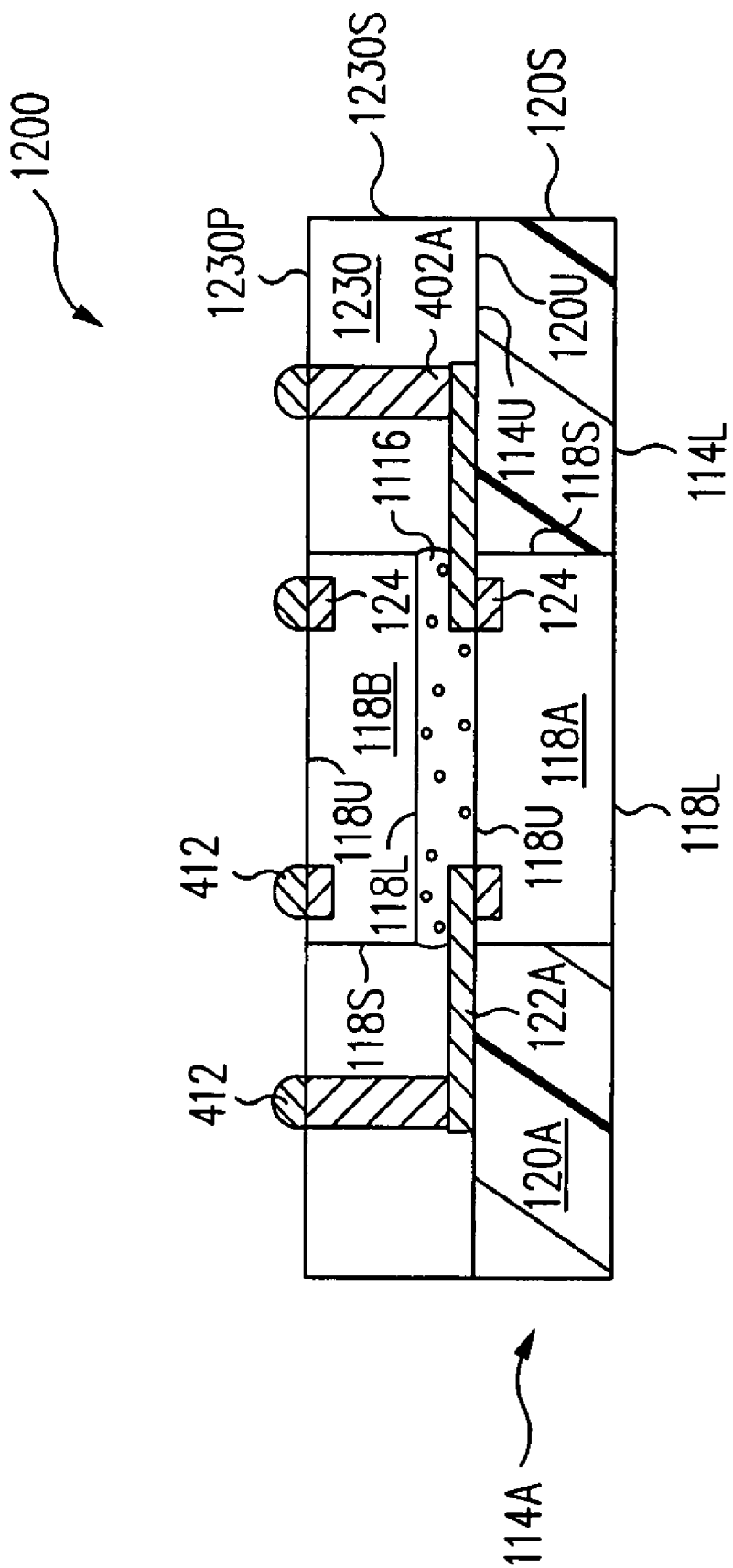

FIG. 12 is a cross-sectional view of a stacked RDL die assembly package 1200 in accordance with another embodiment of the present invention. Stacked RDL die assembly package 1200 of FIG. 12 is similar to stacked RDL die assembly package 1100 of FIG. 11 and only the significant differences between stacked RDL die assembly package 1200 and stacked RDL die assembly package 1100 are discussed below.

Referring now to FIG. 12, in accordance with this embodiment, an encapsulant 1230 encloses upper surface 114U of RDL die assembly 114A and sides 118S of die 118B as shown in FIG. 12. Encapsulant 1230 has sides 1230S substantially coplanar with sides 120S of fan out support 120A of first level RDL die assembly 114A. Further, encapsulant 1230 has a principal surface 1230P substantially coplanar with upper surface 118U of die 118B such that upper surface 118U is exposed from encapsulant 1230. Accordingly, interconnection balls 412 are formed directly on bond pads 124 of die 118B.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A stacked redistribution layer (RDL) die assembly package comprising:
   a first level RDL die assembly comprising:
      a first die comprising bond pads;
      a first fan out support extending outwardly from sides of the first die, the fan out support abutting and entirely enclosing all sides of the first die; and
      first traces electrically connected to the bond pads, the first traces being supported by the first fan out support;
   a second die mounted to the first level RDL die assembly, the second die comprising bond pads on a first surface of the second die;
   a substrate comprising traces on a first surface of the substrate, the first level RDL die assembly being directly mounted to the substrate;
   first level bond wires electrically connecting terminals of the first traces to the traces of the substrate; and
   second level bond wires electrically connecting the bond pads of the second die to the traces of the substrate.

2. The stacked RDL die assembly package of claim 1 further comprising:
   an encapsulant encapsulating the first level RDL assembly and the second die; and
   electrically conductive vias electrically connected to the first traces and the bond pads of the second die, the electrically conductive vias extending from the first traces and the bond pads through the encapsulant and to a principal surface of the encapsulant, wherein sides of the encapsulant are substantially coplanar with sides of the first fan out support.

3. A stacked redistribution layer (RDL) die assembly package comprising:
   a first level RDL die assembly comprising:
      a first die comprising bond pads;
      a first fan out support extending outwardly from sides of the first die, the fan out support abutting and entirely enclosing all sides of the first die;
      first traces electrically connected to the bond pads, the first traces being supported by the first fan out support;
   a substrate comprising traces on a first surface of the substrate, the first level RDL die assembly being directly mounted to the substrate;
   first level bond wires electrically connecting terminals of the first traces to the traces of the substrate; and a second die mounted to the first level RDL die assembly, the second die comprising bond pads on a first surface of the second die.

4. The stacked RDL die assembly package of claim 3 further comprising:
a second level RDL die assembly mounted to the first level RDL die assembly, the second level RDL die assembly comprising:
the second die;
a second fan out support extending outwardly from sides of the second die; and
second traces electrically connected to the bond pads of the second die, the second traces being supported by the second fan out support.

5. The stacked RDL die assembly package of claim 4 wherein the second level RDL die assembly is smaller than the first level RDL die assembly, the second level RDL die assembly being mounted inward of the terminals of the first traces.

6. The stacked RDL die assembly package of claim 5 wherein the first die is the same size as the second die.

7. The stacked RDL die assembly package of claim 6 wherein the second fan out support is smaller than the first fan out support.

8. The stacked RDL die assembly package of claim 4 wherein the second level RDL die assembly is pyramid stacked on the first level RDL die assembly.

9. The stacked RDL die assembly package of claim 4 further comprising a third level RDL die assembly mounted to the second level RDL die assembly, the third level RDL die assembly comprising:
a third die comprising bond pads;
a third fan out support extending outwardly from sides of the third die; and
third traces electrically connected to the bond pads of the third die, the third traces being supported by the third fan out support, wherein the third level RDL die assembly is smaller than the second level RDL die assembly, the third level RDL die assembly being mounted inward of terminals of the second traces.

10. The stacked RDL die assembly package of claim 4 wherein the second level RDL die assembly further comprises:
electrically conductive vias extending through the second fan out support, the electrically conductive vias comprising upper lands and lower lands, the upper lands being electrically connected to the second traces; and
electrically conductive bumps electrically connecting the lower lands to the first traces.

11. The stacked RDL die assembly package of claim 4 further comprising a third level RDL die assembly mounted to the second level RDL die assembly, the third level RDL die assembly comprising:
a third die comprising bond pads;
a third fan out support extending outwardly from sides of the third die; and
third traces electrically connected to the bond pads of the third die, the third traces being supported by the third fan out support, wherein the third level RDL die assembly is the same size as the first level RDL die assembly, the second level RDL die assembly spacing the third level RDL die assembly above the first level bond wires.

12. The stacked RDL die assembly package of claim 4 further comprising second level bond wires electrically connecting terminals of the second traces to the traces of the substrate.

13. The stacked RDL die assembly package of claim 4 wherein the second level RDL die assembly further comprises:
electrically conductive vias extending through the second fan out support, the electrically conductive vias of the second level RDL die assembly comprising upper lands and lower lands;
electrically conductive bumps electrically connecting the lower lands of the second level RDL die assembly to the first traces of the first level RDL die assembly; and
an underfill material enclosing the bumps.

14. The stacked RDL die assembly package of claim 3 further comprising an adhesive mounting a first surface of the first level RDL die assembly to the first surface of the substrate.

15. A stacked redistribution layer (RDL) die assembly package comprising:
a first level RDL die assembly comprising:
a first die comprising bond pads;
a first fan out support extending outwardly from sides of the first die, the fan out support abutting and entirely enclosing all sides of the first die;
first traces electrically connected to the bond pads, the first traces being supported by the first fan out support;
a second die mounted to the first level RDL die assembly, the second die comprising bond pads on a first surface of the second die;
a substrate comprises traces on a first surface of the substrate, the first level RDL die assembly being directly mounted to the substrate; and
first level bond wires electrically connecting terminals of the first traces to the traces of the substrate.

\* \* \* \* \*

UNITED STATES PATENT AND TRADEMARK OFFICE
CERTIFICATE OF CORRECTION

PATENT NO. : 7,550,857 B1
APPLICATION NO. : 11/560496
DATED : June 23, 2009
INVENTOR(S) : Joseph Marco Longo and Christopher M. Scanlan It is certified that error appears in the above-identified patent and that said Letters Patent is hereby corrected as shown below:

In Column 16, Line 1, Claim 11, replace "claim 4" with --claim 10--.

Signed and Sealed this

Third Day of November, 2009

David J. Kappos
*Director of the United States Patent and Trademark Office*